United States Patent
Crosby

(10) Patent No.: US 7,160,629 B2
(45) Date of Patent: Jan. 9, 2007

(54) TIN PLATING

(75) Inventor: Jeffrey N. Crosby, Nuneaton (GB)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 11/263,486

(22) Filed: Oct. 31, 2005

(65) Prior Publication Data

US 2006/0051610 A1 Mar. 9, 2006

Related U.S. Application Data

(60) Continuation of application No. 10/872,799, filed on Jun. 21, 2004, now abandoned, which is a division of application No. 10/139,562, filed on May 6, 2002, now Pat. No. 6,797,142.

(30) Foreign Application Priority Data

May 24, 2001 (GB) ................ 0112599.6
May 25, 2001 (GB) ................ 0112769.5

(51) Int. Cl.
 *B32B 15/01* (2006.01)
 *C25D 3/32* (2006.01)

(52) U.S. Cl. ...................... 428/646; 428/935

(58) Field of Classification Search ............ 428/646, 428/647, 645, 435
 See application file for complete search history.

(56) References Cited

U.S. PATENT DOCUMENTS

| | | | |
|---|---|---|---|
| 3,767,540 A | 10/1973 | Rosenberg | |
| 3,769,187 A | 10/1973 | Chu | |
| 3,838,026 A | 9/1974 | Koch | |
| 4,126,524 A | 11/1978 | Hradil et al. | |
| 4,376,685 A | 3/1983 | Watson | |
| 4,662,999 A | 5/1987 | Opaskar et al. | |
| 4,749,626 A | 6/1988 | Kadija et al. | |
| 4,885,064 A | 12/1989 | Bokisa et al. | |
| 4,935,312 A | 6/1990 | Nakayama et al. | |
| 4,959,278 A | 9/1990 | Shimauchi et al. | |
| 5,021,130 A | 6/1991 | Metzger et al. | |
| 5,282,954 A | 2/1994 | Opaskar | |
| 5,393,573 A | 2/1995 | MacKay | |
| 5,417,840 A | 5/1995 | Block et al. | |
| 5,750,017 A | 5/1998 | Zhang | |
| 5,759,381 A | 6/1998 | Sakurai et al. | |
| 6,195,248 B1 | 2/2001 | Kunishi et al. | |
| 6,361,823 B1 | 3/2002 | Bokisa et al. | |
| 6,475,643 B1 | 11/2002 | Hasegawa et al. | |
| 6,508,927 B1 | 1/2003 | Yanada et al. | |
| 6,860,981 B1 | 3/2005 | Schetty et al. | |
| 2002/0064676 A1 | 5/2002 | Bokisa et al. | |
| 2002/0166774 A1 | 11/2002 | Schetty et al. | |
| 2002/0185716 A1 | 12/2002 | Abys et al. | |
| 2002/0187364 A1 | 12/2002 | Heber et al. | |

FOREIGN PATENT DOCUMENTS

| | | |
|---|---|---|
| DE | 3121016 A1 | 12/1982 |
| DE | 3800918 | 7/1989 |
| GB | 1 526 076 | 9/1978 |
| GB | 2 030 177 A | 4/1980 |
| GB | 1 583 923 | 2/1981 |
| JP | 51-143533 | 12/1976 |
| JP | 52-045539 | 4/1977 |
| JP | 52-075621 | 6/1977 |
| JP | 56023295 A | 3/1981 |
| JP | 61-030656 | 2/1986 |
| JP | 01 316951 | 12/1989 |
| JP | 02-170996 | 7/1990 |
| JP | 8-176882 | 7/1996 |
| JP | 11-193487 | 7/1999 |
| JP | 11-193488 | 7/1999 |
| JP | 2001-49486 | 2/2001 |

*Primary Examiner*—John J. Zimmerman
(74) *Attorney, Agent, or Firm*—John J. Piskorski

(57) ABSTRACT

Electrolyte compositions for the deposition of tin and tin-alloys on a substrate are disclosed, along with methods of electroplating tin and tin-alloys using such compositions. These electrolyte compositions are useful for high speed tin plating.

6 Claims, No Drawings

TIN PLATING

The present application is a continuation application of U.S. co-pending patent application Ser. No. 10/872,799 filed Jun. 21, 2004 now abandoned which is a divisional of U.S. patent application Ser.No. 10/139,562 filed May 06, 2002 which is now U.S. Pat. No. 6,797,142.

BACKGROUND OF THE INVENTION

This invention relates generally to the field of plating metal on a substrate. In particular, the present invention relates to electrolyte compositions and methods for depositing tin and tin-alloys.

Electroplating baths for depositing tin, lead, or their alloys have been used for many years in electroplating equipment. High speed electroplating equipment and processes are well-known in the industry and generally consist of directing the work to be plated into the electroplating cell from one end, allowing the work to proceed through the electroplating cell and exit thereafter the cell at the other end. The electroplating solution is removed or overflows the electroplating cell into a reservoir and the solution is pumped from the reservoir back into the electroplating cell to provide vigorous agitation and solution circulation. Many variations of these electroplating cells can exist, but the general features are as described.

There are a number of desirable features that the electroplating solution should possess for improved operation in this type of equipment or processing. The solution must be able to electroplate the desired deposit at the high speeds required. The solution must deposit tin which meets the solderability or reflow requirements of the specific application. The solution should be stable and the additives in the solution must withstand exposure to the strong acid solution as well as to the introduction of air, which would take place as a result of the vigorous solution movement in high speed plating machines. The solution should remain clear and free from turbidity, even at elevated temperatures such as 120° to 130° F. (ca. 48° to 55° C.) or higher. Due to the high current densities involved it is often advantageous to operate these solutions at an elevated temperature. The additives used must be of a type that will not turn the solution turbid at such elevated temperatures.

Due to the vigorous solution movement and solution mixing with air in such high speed plating processes, there is a strong tendency to produce a foam which is detrimental to the electroplating process. Under extreme conditions, this foam can build up in the reservoir tank with resultant overflow onto the floor, thereby losing a large quantity of solution to the waste stream. Foam can also interfere with the operation of the pump that is being used to generate agitation. Arcing between the anode and cathode is also possible due to the presence of foam. Thus, the additives used in the electroplating solutions should not generate foam in the plating equipment.

Many electrolytes have been proposed for electroplating tin, lead, and tin/lead alloys. For example, U.S. Pat. No. 5,174,887 (Federman et al.) discloses a process for the high speed electroplating of tin having as a surfactant an alkylene oxide condensation product of an organic compound having at least one hydroxy group and 20 carbon atoms or less. The organic compounds include an aliphatic hydrocarbon of between 1 and 7 carbon atoms, an unsubstituted aromatic compound or an alkylated aromatic compound having 6 carbon atoms or less in the alkyl moiety.

During use, a high speed tinplate line may slow down, such as when a new metal coil is welded to the end of the metal strip that is being plated. During such slow down periods the rate at which the metal substrate passes through the electroplating bath slows down. Theoretically, in order to maintain a consistent tin or tin-alloy deposit thickness, i.e. coating weight, the plating bath must be run at a lower current density. However, current tin and tin-alloy high speed electroplating baths, including those discussed above, fail to produce a consistent appearance of tin or tin-alloy over a sufficiently wide current density range to allow for such slow down periods.

At low current densities, conventional bright tin electroplating baths often produce hazy tin deposits, particularly on nickel or nickel alloy substrates. Many conventional tin electroplating baths also produce a wide and dark or black line at the air-bath interface when such baths are used in partial immersion applications. Such lines are undesirable.

Certain polyalkyleneimines are known for use in zinc electroplating baths. See, for example, German Patent Application DE 3121016. Such polyalkyleneimines may be substituted with carbamoyl and/or thiocarbamoyl groups. The use of polyalkyleneimines is not disclosed for use in tin or tin-alloy plating baths.

U.S. Pat. No. 5,282,954 (Opaskar) discloses alkoxylated diamine surfactants for use in tin electroplating baths. Carboxyalkylated polyalkyleneimines are not disclosed in this patent.

There is a continuing need for plating baths that will deposit tin or tin-alloys over a wide current density range while maintaining a uniform deposit appearance over the current density range, particularly for use in high speed plating systems.

SUMMARY OF THE INVENTION

It has been surprisingly found that tin or tin-alloy may be uniformly deposited over a wide current density range using the electrolyte compositions of the present invention. It has been further surprisingly found that the electrolyte compositions of the present invention plate tin or tin-alloy at high current densities with low metal concentrations, while producing a uniform deposit appearance over the entire current density range.

In one aspect, the present invention provides an electrolyte composition for depositing tin or tin-alloy on a substrate, including one or more tin compounds, one or more acidic electrolytes, and one or more carboxyalkylated polyalkyleneimine compounds.

In another aspect, the present invention provides a method for depositing tin or tin-alloy on a substrate including the steps of contacting the substrate with the electrolyte composition described above and applying a sufficient current density to the electrolyte composition to deposit the tin or tin-alloy on the substrate.

In yet another aspect, the present invention provides a substrate having a tin or tin-alloy deposited thereon according to the method described above.

In a further aspect, the present invention provides an electrolyte composition for depositing tin-copper alloy on a substrate, including one or more tin compounds, one or more copper compounds, one or more acidic electrolytes, and one or more carboxyalkylated polyalkyleneimine compounds.

In a still further aspect, the present invention provides a method for high speed electroplating of tin or tin-alloys including the steps of: a) utilizing high speed electroplating equipment comprising an electroplating cell; an overflow reservoir adjacent the cell; means for returning solution from the reservoir to the electroplating cell; means for directing a substrate to be plated from an entry point at one end of the cell to an exit at a second end of the cell; b) introducing an electrolyte including a basis solution of one or more tin compounds, one or more acidic electrolytes, and one or more carboxyalkylated polyalkyleneimine compounds; and c) continuously electroplating substrates with tin or tin-alloy at a sufficient current density and at a sufficient temperature for high speed electroplating as the substrates pass through the electroplating solution within the cell.

In yet a further aspect, the present invention provides a method of depositing tin or tin-alloy having reduced whiskering on a substrate as described above.

DETAILED DESCRIPTION OF THE INVENTION

As used throughout this specification, the following abbreviations shall have the following meanings, unless the context clearly indicates otherwise: ° C. degrees Centigrade; ° F.=degrees Fahrenheit; g=gram; L=liter; mL=milliliter; μm=micron=micrometer; wt %=percent by weight; cm=centimeters; ca.=cira and ASD=amps per square decimeter. The terms "depositing" and "plating" are used interchangeably throughout this specification. "Halide" refers to fluoride, chloride, bromide and iodide. "Alkyl" refers to linear, branched and cyclic alkyl. All percentages are by weight, unless otherwise noted. All numerical ranges are inclusive and combinable in any order, except where it is obvious that such numerical ranges are constrained to add up to 100%.

The electrolyte compositions of the present invention include one or more tin compounds, one or more acidic electrolytes, and one or more carboxyalkylated polyalkyleneimine compounds. The electrolyte compositions may further include one or more alloying components and optionally one or more additives to enhance the efficiency and/or quality of the plating.

The one or more tin compounds useful in the present invention are any solution soluble tin compound. Suitable tin compounds include, but are not limited to tin salts, such as tin halides; tin sulfates; tin alkane sulfonate such as tin methane sulfonate, tin ethanesulfonate and tin propanesulfonate; tin aryl sulfonate such as tin phenyl sulfonate and tin toluene sulfonate; tin alkanol sulfonate; and the like. When tin halide is used, it is preferred that the halide is chloride. It is preferred that the tin compound is tin sulfate, tin chloride, tin alkane sulfonate or tin aryl sulfonate, and more preferably tin sulfate or tin methane sulfonate. Suitable tin alkane sulfonates include tin methanesulfonate, tin ethanesulfonate and tin propanesulfonate. Suitable tin aryl sulfonates include tin phenylsulfonate and tin toluenesulfonate. The tin compounds useful in the present invention are generally commercially available from a variety of sources and may be used without further purification. Alternatively, the tin compounds useful in the present invention may be prepared by methods known in the literature.

The amount of tin compound useful in the electrolyte compositions of the present invention is any amount that provides a tin content typically in the range of 5 to 100 g/L, and preferably 10 to 70 g/L. When the compositions of the present invention are used in a low speed plating process, the amount of tin present in the electrolyte composition is typically in the range of 5 to 60 g/L, and preferably 10 to 20 g/L. When the compositions of the present invention are used in a high speed plating process, the amount of tin present in the electrolyte composition is typically in the range of 20 to 100 g/L, and preferably 40 to 70 g/L. When the compositions of the present invention are used in high speed tin plating of steel, the amount of tin is typically in the range of 5 to 50 g/L, and preferably 10 to 30 g/L. Mixtures of tin compounds may also be used advantageously in the present invention, provided that the total amount of tin is in the range of from 5 to 100 g/L.

Any acidic electrolyte that is solution soluble and does not otherwise adversely affect the electrolyte composition may be used advantageously in the present invention. Suitable acidic electrolytes include, but are not limited to alkane sulfonic acids, such as methanesulfonic acid, ethanesulfonic acid and propanesulfonic acid, aryl sulfonic acids such as phenylsulfonic acid or toluenesulfonic acid, sulfuric acid, sulfamic acid, hydrochloric acid, hydrobromic acid and fluoroboric acid. Mixtures of acidic electrolytes are particularly useful, such as, but not limited to, mixtures of alkane sulfonic acids and sulfuric acid. Thus, more than one acidic electrolyte may be used advantageously in the present invention. The acidic electrolytes useful in the present invention are generally commercially available and may be used without further purification. Alternatively, the acidic electrolytes may be prepared by methods known in the literature.

Typically, the amount of acidic electrolyte is in the range of 10 to 400 g/L, and preferably 100 to 200 g/L. When the compositions of the present invention are used in the high speed tin plating of steel, the acidic electrolyte is typically present in an amount in the range of 20 to 80 g/L, and preferably 30 to 60 g/L. It is preferred that when the tin compound is a halide that the acidic electrolyte is the corresponding acid. For example, when tin chloride is used in the present invention, it is preferred that the acidic electrolyte is hydrochloric acid.

The present tin electrolyte compositions also contain one or more carboxyalkylated polyalkyleneimine compounds. Carboxyalkylated polyalkyleneimine compounds refer to polyalkyleneimine compounds containing one or more carboxyalkyl substituents. A wide variety of carboxyalkylated polyalkyleneimine compounds are suitable for use in the present invention, including, but not limited to, carboxyalkylated polyethyleneimine, carboxyalkylated polypropyleneimine and carboxyalkylated polybutyleneimine. Preferably, the carboxyalkylated polyalkyleneimine compounds are carboxymethylated polyethyleneimines. Typically, the carboxyalkylated polyalkyleneimine compounds have a molecular weight of greater than or equal to 500 Daltons, preferably greater than or equal to 1000 Daltons, and more preferably greater than or equal to 2500 Daltons. Particularly suitable carboxyalkylated polyalkyleneimine compounds have a molecular weight of from 1000 to 200,000 Daltons, and more particularly from 10,000 to 150,000 Daltons. Typically, such carboxyalkylated polyalkyleneimine compounds have 10% or greater carboxyalkylation, preferably 20% or greater carboxyalkylation, more preferably 30% or greater carboxyalkylation and even more preferably 50% or greater carboxyalkalyation. Particularly useful carboxyalkylated polyalkyleneimine compounds have 75% or greater carboxyalkalyation. Such carboxyalkylated polyalkyleneimine compounds are generally commercially available, such as those sold under the TRILON tradename from BASF, Ludwigshafen, Germany.

In an alternate embodiment, the carboxyalkylated polyalkyleneimine compounds of the present invention may be further alkoxylated, such as by reaction with ethylene oxide, propylene oxide or both. Suitable alkoxylated carboxyalkylated polyalkyleneimine compounds are those containing up to 20 moles of ethylene oxide ("EO"), up to 20 moles of propylene oxide ("PO"), or up to 40 moles of a mixture of EO and PO. Examples of such compounds include, but are not limited to, carboxylated polyalkyleneimine compounds reacted with any of the following: 5 moles of EO; 8 moles of EO; 10 moles of EO; 12 moles of EO; 3 moles of PO; 5 moles of PO; 8 moles of PO; 10 moles of PO; 3 moles of EO and 5 moles of PO; 8 moles of EO and 5 moles of PO; 15 moles of EO and 8 moles of PO; 15 moles of EO and 12 moles of PO; 10 moles of EO and 10 moles of PO; and the like.

The tin electrolyte compositions may further include one or more alkylene oxide compounds. The one or more alkylene oxide compounds useful in the present invention are any which yield deposits having good solderability, good matte or lustrous finish with satisfactory grain refinement, are stable in the acidic electroplating bath, electroplate at high speeds, are substantially low foaming, and provide a cloud point of the bath above about 110° F. (ca. 43° to 44° C.). It is preferred that the alkylene oxide compounds provide no foam to the bath during the electroplating process. Suitable alkylene oxide compounds include, but are not limited to, ethylene oxide/propylene oxide ("EO/PO") copolymers, alkylene oxide condensation products of an organic compound having at least one hydroxy group and 20 carbon atoms or less, compounds prepared by adding oxypropylene to polyoxyethylene glycol, and the like. Typically, the EO/PO copolymers have an average molecular weight in the range of from about 500 to about 10,000 Daltons, and preferably from about 1000 to about 5000 Daltons. It is preferred that the alkylene oxide compound is an EO/PO copolymer. Typically, the one or more alkylene oxide compounds are present in the electrolyte compositions of the present invention in an amount of from 0.1 to 15 g/L, and preferably 0.5 to 10 g/L.

Suitable alkylene oxide condensation products of an organic compound having at least one hydroxy group and 20 carbon atoms or less include those having an aliphatic hydrocarbon of from one to seven carbon atoms, an unsubstituted aromatic compound or an alkylated aromatic compound having about six carbon atoms or less in the alkyl moiety, such as those disclosed in U.S. Pat. No. 5,174,887, herein incorporated by reference to the extent it teaches the preparation and use of these compounds. The aliphatic alcohols may be saturated or unsaturated. Suitable aromatic compounds are those having up to two aromatic rings. The aromatic alcohols typically have up to 20 carbon atoms prior to derivatization with ethylene oxide. Such aliphatic and aromatic alcohols may be further substituted, such as with sulfate or sulfonate groups. Such suitable alkylene oxide compounds include, but are not limited to: ethyloxylated polystyrenated phenol having 12 moles of EO, ethyloxylated butanol having 5 moles of EO, ethyloxylated butanol having 16 moles of EO, ethyloxylated butanol having 8 moles of EO, ethyloxylated octanol having 12 moles of EO, ethyloxylated beta-naphthol having 13 moles of EO, ethyloxylated bisphenol A having 10 moles of EO, ethyloxylated sulfated bisphenol A having 30 moles of EO and ethyloxylated bisphenol A having 8 moles of EO.

Additionally, the present compositions may include one or more polyalkylene glycols. Suitable polyalkylene glycols are any which are compatible with the electrolyte composition, yield deposits having good solderability, good matte or lustrous finish with satisfactory grain refinement, are stable in the acidic electroplating bath, electroplate at high speeds, are substantially low foaming, and provide a cloud point of the bath above about 110° F. (ca. 43° to 44° C.). It is preferred that the alkylene oxide compounds provide no foam to the bath during the electroplating process. Suitable polyalkylene glycols include, but are not limited to, polyethylene glycol and polypropylene glycol, and preferably polyethylene glycol. Such polyalkylene glycols are generally commercially available from a variety of sources and may be used without further purification.

Typically, the polyalkylene glycols useful in the present invention are those having an average molecular weight in the range of from about 200 to about 100,000 Daltons, and preferably from about 900 to about 20,000 Daltons. Such polyalkylene glycols are present in the electrolyte compositions of the present invention in an amount of from about 0.1 to about 15 µL, preferably from about 0.25 to about 10 g/L, and more preferably from about 0.5 to about 8 g/L.

It will be appreciated by those skilled in the art that one or more other metal compounds may be combined with the electrolyte composition of the present invention. Such other metal compounds are necessary for the plating of tin-alloys. Suitable other alloying metals include, but are not limited to, lead, nickel, copper, bismuth, zinc, silver, indium and the like. Copper is particularly suitable. Such other metal compounds useful in the present invention are any which provide the metal to the electrolyte composition in a soluble form. Thus, the other metal compounds include, but are not limited to, salts such as metal halides; metal sulfates; metal alkane sulfonates such as metal methane sulfonate; metal aryl sulfonates such as metal phenyl sulfonate and metal toluene sulfonate; metal alkanol sulfonates; and the like.

The choice of other metal compound and the amount of such other metal compound present in the electrolyte composition depends upon the tin-alloy to be deposited, and is well known to those skilled in the art. For example, when copper is present, it is preferred that the copper is in an amount of from 0.01 to 10 g/L copper and more preferably 0.02 to 5 g/L. When the compositions of the present invention are used in a non-high speed plating process, the amount of copper present in the electrolyte composition is typically in the range of 0.01 to 5 g/L, and preferably 0.02 to 2 g/L. When such compositions are used in a high speed plating process, the amount of copper present in the electrolyte composition is typically in the range of 0.5 to 10 g/L, and preferably 0.5 to 5 g/L. Mixtures of copper compounds may be used advantageously in the present invention.

Thus, the present invention also provides an electrolyte composition for depositing tin-copper alloy on a substrate, including one or more tin compounds, one or more copper compounds, one or more acidic electrolytes, and one or more carboxyalkylated polyalkyleneimine compounds.

It will be appreciated by those skilled in the art that one or more other additives may be combined with the electrolyte composition of the present invention, such as reducing agents, grain refiners such as hydroxy aromatic compounds and other wetting agents, brightening agents, compounds to extend the current density range, such as carboxylic acids, and the like. Mixtures of additives may also be used in the present invention.

Reducing agents may be added to the electrolyte composition of the present invention to assist in keeping the tin in a soluble, divalent state. Suitable reducing agents include, but are not limited to, hydroquinone and hydroxylated aromatic compounds, such as resorcinol, catechol, and the like. Such reducing agents are disclosed in U.S. Pat. No. 4,871,429, herein incorporated by reference to the extent it teaches the preparation and use of such compounds. The amount of such reducing agent is well known to those skilled in the art, but is typically in the range of from about 0.1 g/L to about 5 g/L.

Bright deposits may be obtained by adding brighteners to the electrolyte compositions of the present invention. Such brighteners are well known to those skilled in the art. Suitable brighteners include, but are not limited to aromatic aldehydes such as chlorobenzaldehyde, derivatives of aromatic aldehydes such as benzal acetone, and aliphatic aldehydes such as acetaldehyde or glutaraldehyde. Such brighteners are typically added to the compositions of the present invention to improve the appearance and reflectivity of the deposit. Typically, brighteners are used at an amount of 0.5 to 3 g/L, and preferably 1 to 2 g/L.

It will be appreciated by those skilled in the art that carboxy aromatic compounds or other wetting agents may be added to the electrolyte compositions of the present invention to provide further grain refinement. Such carboxy aromatic compounds function as grain refiners and may be added to the electrolyte composition of the present invention to further improve deposit appearance and operating current density range. A wide variety of such carboxy aromatic compounds are well known to those skilled in the art, such as picolinic acid, nicotinic acid, and isonicotinic acid. Suitable other wetting agents include, but are not limited to: alkoxylates, such as the polyethoxylated amines sold under the tradenames of JEFFAMINE T-403, available from Huntsman Corporation, or TRITON RW, or sulfated alkyl ethoxylates, such as those sold under the tradenames TRITON QS-15, and gelatin or gelatin derivatives. The amounts of such grain refiners useful in the present invention are well known to those skilled in the art and typically are in the range of 0.01 to 20 g/L, preferably 0.5 to 8 g/L, and more preferably 1 to 5 g/L.

Which optional additives, if any, are added to the electrolyte compositions of the present invention depends upon the results and types of deposits desired. It will be clear to one skilled in the art which additives and in what amounts are needed to achieve the desired finished deposit.

Electroplating baths containing the electrolyte compositions of the present invention are typically prepared by adding to a vessel one or more acidic electrolytes, followed by one or more tin compounds, one or more carboxyalkylated polyalkyleneimine compounds and any optional additives such as one or more alkylene oxide compounds and/or one or more polyalkylene glycols. Water is also typically added. Other orders of addition of the components of the compositions of the present invention may be used. Once the bath is prepared, undesired material is removed, such as by filtration, and then water is added to adjust the final volume of the bath. The bath may be agitated by any known means, such as stirring, pumping, sparging or jetting the solution, for increased plating speed.

The electrolyte compositions of the present invention and plating baths prepared therefrom typically are acidic, i.e. having a pH of less than 7, typically less than 1. An advantage of the electrolyte compositions of the present invention is that pH adjustment of the electroplating bath is not necessary.

The electrolyte compositions of the present invention are useful in any plating method where a tin or tin-alloy deposit is desired. Suitable plating methods include, but are not limited to barrel plating, rack plating and high speed plating. A tin or tin-alloy deposit may be plated on a substrate by the steps of contacting the substrate with the electrolyte composition described above and passing a current through the electrolyte to deposit the tin or tin-alloy on the substrate.

Any substrate that can be electrolytically plated with a metal is suitable for plating according to the present invention. Suitable substrates include, but are not limited to: steel, copper, copper alloys, nickel, nickel alloys, nickel-iron containing materials, electronic components, plastics, and the like. Suitable plastics include plastic laminates, such as printing wiring boards, particularly copper clad printed wiring boards. Suitable electronic components that can be plated with the present electrolyte compositions include connectors, lead frames, packaging, optoelectronic components, and the like. The present compositions may also be used to deposit tin or tin-alloy solderable compositions, such as solder bumps on semiconductor wafers.

The electrolyte compositions of the present invention are particularly suitable for electroplating of steel, particularly in high speed electroplating processes, and more particularly for the tin and/or tin alloy plating of nickel and nickel alloys. In one embodiment, a layer of nickel or nickel alloy is deposited on a substrate and then a layer of tin or tin alloy is deposited on the nickel or nickel alloy layer. In this way, the nickel or nickel alloy functions as an undercoat for the tin or tin alloy deposit.

The substrate to be plated may be contacted with the electrolyte composition in any manner known in the art. Typically, the substrate is placed in a bath containing the electrolyte composition of the present invention. In an alternative embodiment, the baths of the present invention may be sprayed or flood coated on the substrate to be plated.

Typically, the current density used to plate the tin or tin-alloy of the present invention is in the range of, but not limited to, 0.1 to 200 ASD. When a low speed electroplating process is used, the current density is typically in the range of 0.1 to 4 ASD, and preferably 0.1 to 3 ASD. When a high speed electroplating process is used, the current density is typically in the range of 5 to 200 ASD, and preferably 10 to 150 ASD. For example, when the electrolyte compositions of the present invention are used to deposit tin on connector strip in a high speed plating processes, a suitable current density is 10 to 60 ASD, resulting in a tin deposit having a thickness of typically from 1 to 15 microns.

Typically, the tin or tin-alloy of the present invention may be deposited at a temperature in the range of, but not limited to, 60° to 150° F. (ca. 15° to 66° C.) or higher, and preferably 60° to 125° F. (ca. 15° to 55° C.), and more preferably 75° to 120° F. (ca. 15° to 30° C.). For certain bright deposit plating baths, it is preferred that the bath temperature not exceed 30° C.

In general, the length of time a substrate remains in a plating bath containing the electrolyte compositions of the present invention is not critical. Longer times typically result in thicker deposits while shorter times typically result in thinner deposits, for a given temperature and current density. Thus, the length of time a substrate remains in a plating bath may be used to control the thickness of the resulting deposit.

The electrolyte compositions of the present invention are particularly useful for depositing tin, but may also be used to deposit tin-alloys containing 60 to 99.5 wt % tin and 0.5 to 40 wt % other metals, based on the weight of the alloy, as measured by either atomic adsorption spectroscopy ("AAS") or inductively coupled plasma ("ICP"). The present compositions are particularly suitable for depositing a tin-copper alloy containing 97 to 99 wt % tin and 1 to 3 wt % copper.

A further advantage of the electrolyte compositions of the present invention is that they may be successfully used to deposit tin or tin-alloy in a high speed electroplating process.

The term "high speed electroplating" refers to those processes which operate at a current density about 5 ASD or greater using the above described equipment. Typical current densities are in the range of 5 to 200 ASD or higher, preferably 10 to 150 ASD, and more preferably 20 to 50 ASD. Typically, such processes also operate above a temperature of about 70° F. (ca. 21° C.). Suitable temperatures include, but are not limited to, those in the range of 70° to 140° F. (ca. 21° to 60° C.) or higher, preferably greater than 85° F. (ca. 29° C.), and more preferably greater than 95° F. (ca. 35° C.).

The electrolyte compositions of the present invention are particularly suitable for tin electroplating of steel, copper alloys, brass and nickel-plated brass, particularly in high speed electroplating processes. When the compositions of the present invention are used in high speed tin plating of nickel-plated brass, the amount of tin is typically in the range of 5 to 100 g/L. The acidic electrolyte is typically present in such compositions in an amount in the range of 50 to 250 g/L, and preferably 100 to 200 g/L. Current densities of 10 to 60 ASD are suitable for the high speed tin plating of nickel-plated brass according to the present invention. Suitable temperatures include, but are not limited to, those in the range of 70° to 140° F. (ca. 21° to 60° C.) or higher, preferably greater than 85° F. (ca. 29° C.), and more preferably greater than 95° F.

Such a method for high speed electroplating of tin or tin-alloys, such as on steel, includes the steps of: a) utilizing high speed electroplating equipment comprising an electroplating cell; an overflow reservoir adjacent the cell; means for returning solution from the reservoir to the electroplating cell; means for directing a substrate to be plated from an entry point at one end of the cell to an exit at a second end of the cell; b) introducing an electrolyte including a basis solution of one or more tin compounds, one or more acidic electrolytes, and one or more carboxyalkylated polyalkyleneimine compounds; and c) continuously electroplating substrates with tin or tin-alloy at a sufficient current density and at a sufficient temperature for high speed electroplating as the substrates pass through the electroplating solution within the cell.

The returning means may be any known means, such as tubes, hoses, conduits, pumps, drains and the like. The directing means may be any known means, such as conveyors, belts, rollers, robot arms and the like.

The high speed electroplating process of the present invention may be performed using any of a variety of high speed electroplating equipment. Such high speed electroplating equipment is well known to those skilled in the art, such as, for example, that disclosed in U.S. Pat. No. 3,819,502, herein incorporated by reference to the extent it teaches such equipment.

The present tin and tin-alloy electroplating baths provide bright, high-speed tin deposits having enhanced brightness across a very wide range of current densities. Such baths also reduce or eliminate hazy tin or tin alloy, particularly tin copper alloy, deposits when low current densities are used, particularly when deposited on nickel or nickel alloy substrates.

It is accepted in the art that matte tin deposits with large grain structure are more resistant to whiskering than bright deposits with fine grain structures. Surprisingly, tin and tin-alloys, particularly bright tin and tin-alloys, deposited according to the present invention show low or reduced whiskering as compared to tin or lead-free tin-alloys deposited using conventional plating baths. The term "whiskering" refers to the formation of tin whiskers. The tin and tin-alloy deposits of the present invention show no or greatly reduced whiskering after storage at 52° C. and 98% relative humidity, as determined by scanning electron microscopy. Preferably, the present tin and tin-alloy deposits show no whiskering after 4 months when stored under such conditions, more preferably no whiskering after 5 months, and still more preferably no whiskering after 6 months storage. Thus, the present invention provides bright tin or bright lead-free tin-alloys having no whiskers after 4 months storage at 52° C. and 98% relative humidity.

The following examples are intended to illustrate further various aspects of the present invention, but are not intended to limit the scope of the invention in any aspect.

EXAMPLE 1

A tin-copper alloy plating bath was prepared by combining 50 g/L tin as tin(II) methane sulfonate; 1 g/L copper as copper(II) methane sulfonate; 160 g/L free methane sulfonic acid, 27.4 g/L ethoxylated beta naphthol; 7.4 g/L ethoxylated bisphenol A, 0.2 g/L of a first brightener; 0.7 g/L of a second brightener, 3.0 g/L of methacrylic acid; 0.76 g/L of a grain refiner and 5.0 g/L of a carboxymethylated polyethyleneimine having a molecular weight of 50,000 Daltons and a degree of carboxymethylation of 80%, sold under the tradename TRILON ES93000.

EXAMPLE 2

A pure tin plating bath was prepared by combining 50 g/L tin as tin(II) methane sulfonate; 160 g/L free methane sulfonic acid, 27.4 g/L ethoxylated beta naphthol; 7.4 g/L ethoxylated bisphenol A, 0.2 g/L of a first brightener; 0.7 g/L of a second brightener, 3.0 g/L of methacrylic acid; 0.76 g/L of a grain refiner and 5.0 g/L of TRILON ES93000, a carboxymethylated polyethyleneimine having a molecular weight of 50,000 Daltons and a degree of carboxymethylation of 80%.

EXAMPLE 3

Comparative

The plating bath of Example 1 was prepared except that no carboxyalkylated polyalkyleneimine was used and the amounts of ethoxylated beta naphthol and ethoxylated bisphenol A were changed to 15.6 g/L and 16.8 g/L, respectively.

EXAMPLE 4

Comparative

The plating bath of Example 2 was prepared except that no carboxyalkylated polyalkyleneimine was used.

EXAMPLE 5

Nickel-plated brass Hull cell panels were plated in the baths of Examples 1–3 at a cell current of 5 amps, such that the effective current density across the panel changed progressively from less than 0.3 ASD to more than 25 ASD.

The plating bath of Example 3 (Comparative) provided a very hazy tin-copper deposit from about 0.3 to about 5 ASD with the rest of the panel being bright and haze-free.

In contrast, the plating bath of Example 1 provided a tin-copper deposit that had enhanced brightness over the full current density range as compared to that obtained from the baths of Example 3. This tin-copper deposit was also completely free of haziness. Thus, the use of carboxyalkylated polyalkyleneimines enhances the brightness of tin-copper deposits and eliminates the haziness of the deposit at lower current densities.

relative humidity. One sample from each set was removed from the test chamber at one month intervals and analyzed by SEM for the presence of whiskers. The data are reported in the following table where whisker formation is rated on a scale of 0 to 4 where 0 represents no whiskers and 4 represents severe whiskering.

| Sample Set | Deposit | Thickness (μm) | Whiskers Observed After Storage | | | | | |
|---|---|---|---|---|---|---|---|---|
| | | | 0 Months | 1 Month | 2 Months | 3 Months | 4 Months | 5 Months |
| Comparative 1 | Matte tin | 3 | 4 | 4 | 4 | 4 | 4 | 4 |
| | | 10 | 0 | 0 | 0 | 4 | 4 | 4 |
| Comparative 2 | Matte tin/copper 96/4 | 3 | 4 | 2 | 2 | 2 | 2 | 2 |
| | | 10 | 2 | 4 | 4 | 4 | 4 | 4 |
| Comparative 3 | Bright tin | 3 | ca. 2 | ca. 4 | — | ca. 2 | ca. 4 | ca. 4 |
| | | 10 | 0 | ca. 4 | ca. 4 | ca. 4 | ca. 4 | ca. 4 |
| 1 | Bright tin/copper 98/2 | 3 | 0 | 0 | 0 | 0 | 0 | 0 |
| | | 10 | 0 | 0 | 0 | 0 | 0 | 0 |
| 2 | Bright tin | 3 | 0 | 0 | 0 | 0 | 0 | 0 |
| | | 10 | 0 | 0 | 0 | 0 | 0 | 0 |
| Control | Matte tin/lead 90/10 | 3 | 0 | 0 | 0 | 0 | 0 | 0 |
| | | 10 | 0 | 0 | 0 | 0 | 0 | 0 |

The plating bath of Example 2 provided a pure tin deposit that was completely free of haziness such that the panel was fully bright from 0.5 ASD to well above 25 ASD. The overall gloss and brightness of the pure tin plated panel was improved compared with such tin deposits obtained using the bath of Example 4. The carboxyalkylated polyalkyleneimine in the bath of Example 2 also extended the range of current density over which a fully bright tin deposit was obtained, as compared with that obtained using the bath of Example 4.

EXAMPLE 6

Samples of etched lead frames made from a copper-rich alloy (Olin 194) were electroplated with tin or tin-alloy. The tin or tin-alloy deposits were either 3 or 10 μm thick. No barrier layers or undercoats were used. Three sets of comparative samples were prepared by depositing matte tin (Comparative 1), matte tin-copper alloy having 96% tin and 4% copper (Comparative 2) or bright tin (Comparative 3) on etched lead frames. The electroplating baths used to prepare the comparative samples were conventional acidic tin or tin-copper electroplating baths and were run using conventional plating conditions. A set of Control samples was prepared by depositing a matte tin-lead alloy layer having 90% tin and 10% lead on etched lead frames using a conventional acidic tin-lead plating bath using standard plating conditions. One set of samples (Sample 1) was prepared by depositing a bright tin-copper alloy having 98% tin and 2% copper using the plating bath of Example 1 and one set of samples (Sample 2) was prepared by depositing a bright tin layer using the plating bath of Example 2.

One plated lead frame from each set of samples was analyzed for the presence of whiskers by scanning electron microscopy (SEM) after plating. The remaining plated lead frames from each set of samples were stored under controlled conditions in a test chamber at 52° C. and 98%

From the above data it can be clearly seen that the bright tin and tin-alloy baths of the present invention provide deposits having reduced whisker formation as compared to conventional bright tin and tin-alloy plating baths.

What is claimed is:

1. A bright tin or bright lead-free tin-alloy deposited on a substrate by (a) providing an electrolyte comprising one or more tin compounds, one or more acidic electrolytes, and one or more carboxylated polyalkyleneimine compounds having a molecular weight of 1000 to 200,000 Daltons and 50% or greater carboxylation, and one or more polyalkylene glycols having a molecular weight range of 200 to 100,000 Daltons, and (b) depositing the bright tin or bright lead-free tin-alloy on the substrate at a current density of 0.1 to 200 ASD, the bright tin or bright lead-free tin-alloy has no whiskers after 4 months storage at 52° C. and 98% relative humidity.

2. A bright tin or bright lead-free tin-alloy deposited on a substrate by (a) providing an electrolyte comprising one or more tin compounds, one or more acidic electrolytes, and one or more carboxylated polyalkyleneimine compounds having a molecular weight of 1000 to 200,000 Daltons and 50% or greater carboxylation, and one or more polyalkylene glycols having a molecular weight range of 200 to 100,000 Daltons, and (b) depositing the bright tin or bright lead-free tin-alloy on the substrate at a current density of 0.1 to 200 ASD, the bright tin or bright lead-free tin-alloy does not have whiskers after 5 months of storage at 52° C. and 98% relative humidity.

3. A bright tin or bright lead-free tin alloy deposited on a substrate from an electrolyte comprising one or more tin compounds, one or more acidic electrolytes, and one or more carboxylated polyalkyleneimine compounds having a molecular weight of 1000 to 200,000 Daltons and 50% or greater carboxylation, and one or more polyalkylene glycols having a molecular weight range of 200 to 100,000 Daltons, and (b) depositing the bright tin or bright lead-free tin-alloy on the substrate at a current density of 0.1 to 200 ASD, the bright tin or bright lead-free tin-alloy does not have whiskers after 6 months of storage at 52° C. and 98% relative humidity.

4. The bright tin or bright lead-free tin alloy of claim 1, wherein an alloying metal is nickel, copper, bismuth, zinc, silver or indium.

5. The bright lead-free tin alloy of claim 1, wherein the tin alloy contains 60 to 99.5 wt % tin and 0.5 to 40 wt % of another metal.

6. The bright lead-free tin-alloy of claim 1, wherein the tin alloy contains 97 to 99 wt % tin and 1 to 3 wt % of copper.

* * * * *